(12) United States Patent
Chu

(10) Patent No.: US 6,379,875 B2
(45) Date of Patent: Apr. 30, 2002

(54) STRIPPER PRETREATMENT

(75) Inventor: John Cheung-Shing Chu, San Jose, CA (US)

(73) Assignee: Shipley Company, LLC, Marlborough, MA (US)

( * ) Notice: Subject to any disclaimer, the term of this patent is extended or adjusted under 35 U.S.C. 154(b) by 0 days.

(21) Appl. No.: 09/865,399

(22) Filed: May 25, 2001

Related U.S. Application Data

(62) Division of application No. 09/590,400, filed on Jun. 8, 2000, now Pat. No. 6,274,296.

(51) Int. Cl.⁷ .............................. G03F 7/40; G03F 7/42; C11D 17/00; B08B 3/00
(52) U.S. Cl. ......................... 430/329; 134/26; 134/29; 510/176; 510/418
(58) Field of Search ................................ 430/331, 329; 510/176, 418; 134/26, 29

(56) References Cited

U.S. PATENT DOCUMENTS

| | | | |
|---|---|---|---|
| 4,202,703 A | 5/1980 | Zuber et al. | 134/2 |
| 4,396,703 A | 8/1983 | Matsumoto et al. | 430/331 |
| 4,701,390 A | 10/1987 | Grunwald et al. | 430/325 |
| 4,786,578 A | 11/1988 | Neisius et al. | 430/329 |
| 4,786,580 A | 11/1988 | Hsieh et al. | 430/331 |
| 4,824,762 A | 4/1989 | Kobayashi et al. | 430/329 |
| 5,597,678 A | 1/1997 | Honda et al. | 430/331 |
| 5,962,197 A | 10/1999 | Chen | 430/331 |

FOREIGN PATENT DOCUMENTS

| | | |
|---|---|---|
| EP | 0 851 305 A1 | 7/1998 |
| WO | WO 88/05813 | 8/1988 |

*Primary Examiner*—Richard L. Schilling
(74) *Attorney, Agent, or Firm*—S. Matthew Cairns

(57) ABSTRACT

Disclosed are compositions useful for the pretreatment of polymeric material to be removed from substrates, such as electronic devices. The compositions of the present invention are particularly suitable for pretreating polymer residues from plasma etch processes. Also disclosed are methods of removing such pretreated polymeric material.

8 Claims, No Drawings

STRIPPER PRETREATMENT

This application is a continuation Ser. No. 09/590,400 filed Jun. 8, 2000 now U.S. Pat. No. 6,274,296.

BACKGROUND OF THE INVENTION

The present invention relates generally to the field of removal of polymeric materials from a substrate. In particular, the present invention relates to compositions and methods as pre-treatments for the removal of polymer material, and particularly plasma induced polymeric material, from electronic devices.

Numerous materials containing polymers are used in the manufacture of electronic devices, such as circuits, disk drives, storage media devices and the like. Such polymeric materials are found in photoresists, solder masks, antireflective coatings, and the like. For example, modern technology utilizes positive-type resist materials for lithographically delineating patterns onto a substrate so that the patterns can be subsequently etched or otherwise defined into the substrate material. The resist material is deposited as a film and the desired pattern is defined by exposing the resist film to energetic radiation. Thereafter the exposed regions are subject to a dissolution by a suitable developer liquid. After the pattern has been thus defined in the substrate the resist material must be completely removed from the substrate to avoid adversely affecting or hindering subsequent operations or processing steps.

It is necessary in such a photolithographic process that the photoresist material, following pattern delineation, be evenly and completely removed from all unexposed areas so as to permit further lithographic operations. Even the partial remains of a resist in an area to be further patterned is undesirable. Also, undesired residue between patterned features can have deleterious effects on subsequent film depositions processes, such as metallization, or cause undesirable surface states and charges leading to reduced device performance.

Numerous polymer stripper compositions have been developed to remove positive and negative photoresists. For example, U.S. Pat. No. 5,962,197 (Chen) discloses a composition for removing photoresists or soldermasks containing 30–80% by weight of a propylene glycol ether, 10–60% by weight of a pyrrolidone, 0.1–5% by weight of potassium hydroxide, 0.1–10% by weight of a surfactant, 0–20% by weight of 1,3-butanediol 0–10% by weight of 2-(2-aminoethoxy)ethanol, and a water content of <1%. Other compositions are known that contain amines, such as alkanolamines, or tetraalkylammonium hydroxides, such as tetramethylammonium hydroxide, as the active polymer removing agent. Surfactants may optionally be used in such compositions. See, for example, PCT patent application WO 88/105813 (Martin et al.) which discloses a mixture having a selected solvent as the major component and a tetraalkylammonium hydroxide as a minor component and optionally a surfactant.

The semiconductor industry is moving toward sub-quarter micron geometry features. As the geometry of the features gets smaller and pattern density increases, plasma etching, reactive ion etching, ion milling and the like are required for the lithographic process. During such plasma etching, reactive ion etching and ion milling processes, the polymeric material is subjected to conditions that make the removal of such polymeric material difficult. During the plasma etch process a photoresist film forms a hard to remove organometallic polymeric residue on the sidewalls of the various features being etched. Furthermore, the photoresist is extensively cross-linked due to the high vacuum and high temperature conditions in the etch chamber. Known cleaning processes do not acceptably remove such polymeric residue. For example, acetone or N-methylpyrrolidinone is currently used at extreme conditions, which include high temperature and extended cycle times. Such use conditions are often above the flashpoint of the solvent which raises certain environmental, health and safety issues regarding operator exposure. In addition, productivity and throughput are adversely affected by the extended process cycle times required. Even with such extreme stripping conditions, the devices may have to undergo wet strip followed by de-scum ($O_2$ plasma ash) and a subsequent wet clean for a wet-dry-wet strip process.

Known stripping compositions for post-plasma etch polymer removal applications have numerous drawbacks including, undesirable flammability, toxicity, volatility, odor, necessity for use at elevated temperatures such as up to 100° C., and high cost due to handling regulated materials. A particular problem with advanced next generation semiconductor devices is that known stripping compositions are incompatible with a variety of thin films in such devices, that is, such known stripping compositions cause corrosion of the thin films, specifically copper, and low-k dielectric material present in such advanced devices.

Methods for increasing the effectiveness of polymer removers have been proposed. For example, U.S. Pat. No. 4,786,578 (Neisius et al.) discloses a rinse solution used after a photoresist stripper. This rinse solution contains a nonionic surfactant and an organic base, such as an alkanolamine, that will form a water-soluble salt with alkylbenzenesulfonic acids. U.S. Pat. No. 4,824,762 (Kobayashi et al.) discloses a photoresist stripper post rinse containing a glycol ether and an aliphatic amine. In both patents, the compositions contain amines which tend to cause corrosion of copper present in the electronic devices. A pretreatment has been proposed using hot (110–125° C.) solvent, see U.S. Pat. No. 4,202,703 (Zuber et al.). In this patent, the pretreatment was followed by a stripper containing a tetraalkylammonium hydroxide and then a post rinse with 1,1,1-trichloroethane. Such a process raises a number of environmental concerns.

There is thus a continuing need to effectively remove polymeric material, including post plasma etch polymeric material, from electronic devices in ways that are environmentally compatible, that do not damage the features and geometries of the electronic devices, that do not cause corrosion of the substrate, particularly thin metal films, and that do not etch dielectric layers in the substrate.

SUMMARY OF THE INVENTION

It has been surprisingly found that polymeric material may be easily and cleanly removed from substrates, particularly 100% copper substrates with dielectric materials by first pretreating the polymeric material and then contacting the polymeric material with a stripping composition. Such polymeric material may be removed according to the present invention without corrosion of underlying metal layers, specifically copper, and without etching of conventional dielectric materials, such as silicon dioxide and low dielectric constant ("low k") materials.

In one aspect, the present invention provides a composition for the pretreatment of polymeric material to be removed from a substrate including one or more polyol compounds, one or more glycol ethers, water and one or more surfactants, wherein the composition is substantially free of amines, alkanolamines, hydroxylamines, tetraalkylammonium hydroxides, ammonium bifluoride, ammonium-tetramethylammonium bifluoride, and alkali metal hydroxides.

In a second aspect, the present invention provides a method of pretreating polymeric material to be removed from a substrate including the step of contacting a substrate containing polymeric material to be removed with the composition described above.

In a third aspect, the present invention provides a method for preparing integrated circuits including one or more polymeric materials to be removed including the steps of: a) contacting the polymeric material with a pretreatment composition including one or more one or more polyol compounds, one or more glycol ethers, water and one or more surfactants for a period of time sufficient to pretreat the polymeric material; b) removing the polymeric material from contact with the pretreatment composition; and c) then contacting the polymeric material with a polymer stripping composition; wherein the pretreatment composition is substantially free of amines, alkanolamines, hydroxylamines, tetraalkylammonium hydroxides, ammonium bifluoride, ammonium-tetramethylammonium bifluoride, and alkali metal hydroxides.

In a fourth aspect, the present invention provides a method for preparing magnetic thin film heads including the steps of: a) contacting a magnetic thin film head precursor containing a polymeric material to be removed with a pretreatment composition including one or more polyol compounds, one or more glycol ethers, water and one or more surfactants for a period of time sufficient to pretreat the polymeric material; b) removing the polymeric material from contact with the pretreatment composition; and c) then contacting the polymeric material with a polymer stripping composition, wherein the pretreatment composition is substantially free of amines, alkanolamines, hydroxylamines, tetraalkylammonium hydroxides, ammonium bifluoride, ammonium-tetramethylammonium bifluoride, and alkali metal hydroxides.

DETAILED DESCRIPTION OF THE INVENTION

As used throughout this specification, the following abbreviations shall have the following meanings unless the context clearly indicates otherwise: ° C.=degrees Centigrade; % wt=percent by weight; mL=milliliter; min=minute; DPM=dipropylene glycol monomethyl ether; DPNB=dipropylene glycol mono-n-butyl ether; and MP-diol=2-methyl-1,3-propanediol. All percentages are by weight. All numerical ranges are inclusive and combinable.

The terms "stripping" and "removing" are used interchangeably throughout this specification. Likewise, the terms "stripper" and "remover" are used interchangeably. "Alkyl" refers to linear, branched and cyclic alkyl. The term "substituted alkyl" refers to an alkyl group having one or more of its hydrogens replaced with another substituent group, such as halogen, cyano, nitro, $(C_1-C_6)$alkoxy, mercapto, $(C_1-C_6)$alkylthio, and the like. As used throughout this specification, the term "aprotic" refers to compounds that do not accept or yield a proton. The term "glycol" refers to dihydric alcohols. Thus, the term "glycol ether" refers to ethers of dihydric alcohols.

Polymeric material on a substrate, including post plasma etch polymeric material, may be effectively removed by first treating or pretreating the polymeric material to be removed with the pretreatment composition according to the present invention. The polymeric material is then removed from contact with the pretreatment composition and then contacted with a polymer stripping composition. It is preferred that the substrate is not rinsed prior to the pretreatment step. It is further preferred that the polymeric material is not rinsed between the pretreating step and the polymer stripping step. Thus, the substrate containing the polymeric material is removed from contact with the pretreatment composition and directly contacted with a polymer stripping composition. Typically, the substrate is rinsed after the polymer stripping step.

The compositions useful for pretreating polymeric material according to the present invention include one or more polyol compounds, one or more glycol ethers, water and one or more surfactants. Such pretreatment compositions are typically substantially free of polymer removing components, such as amines, alkanolamines, hydroxylamines, tetraalkylammonium hydroxides, ammonium bifluoride, ammonium-tetramethylammonium bifluoride, alkali metal hydroxides and the like. It is preferred that the pretreatment compositions of the present invention are free of amines, alkanolamines, hydroxylamines, tetraalkylammonium hydroxides, ammonium bifluoride, ammonium-tetramethylammonium bifluoride and lakali metal hydroxides.

The polyol compounds useful in the present invention are any which are miscible with water and do not destabilize the composition. By the term "polyol compound" is meant a compound having two or more hydroxyl groups. Suitable polyol compounds include aliphatic polyol compounds such as $(C_2-C_{20})$alkanediols, substituted $(C_2-C_{20})$alkanediols, $(C_2-C_{20})$alkanetriols, substituted $(C_2-C_{20})$alkanetriols, and the like. Suitable aliphatic polyol compounds include, but are not limited to, ethylene glycol, propylene glycol, diethylene glycol, dipropylene glycol, triethylene glycol, tripropylene glycol, 2-methyl-1,3-propanediol, butanediol, pentanediol, hexanediol, glycerol and the like. It is preferred that the aliphatic polyol compound is ethylene glycol, propylene glycol, 2-methyl-propanediol, butanediol or pentanediol. Such polyol compounds are generally commercially available, such as from Aldrich (Milwaukee, Wis.), and may be used without further purification. The polyol compounds are typically used in the present invention in an amount in the range of from about 0.5 to about 20% wt based on the total weight of the composition, preferably from about 2 to about 10% wt, and more preferably from about 5 to about 6% wt.

The glycol ethers useful in the present invention are any which are water miscible, compatible with the polyol compound and do not destabilize the composition such as glycol mono$(C_1-C_6)$alkyl ethers and glycol di$(C_1-C_6)$alkyl ethers, such as but not limited to $(C_1-C_{20})$alkanediol $(C_1-C_6)$alkyl ethers and $(C_1-C_{20})$alkanediol di$(C_1-C_6)$alkyl ethers. Suitable glycol ethers include, but are not limited to, ethylene glycol monomethyl ether, diethylene glycol monomethyl ether, propylene glycol monomethyl ether, propylene glycol dimethyl ether, propylene glycol mono-n-butyl ether, dipropylene glycol monomethyl ether, dipropylene glycol dimethyl ether, dipropylene glycol mono-n-butyl ether, tripropylene glycol monomethyl ether, and the like. It is preferred that the glycol ether is dipropylene glycol monomethyl ether, tripropylene glycol monomethyl ether, propylene glycol mono-n-butyl ether or dipropylene glycol mono-n-butyl ether. Such glycol ethers are generally commercially available and may be used without further purification. Typically, the glycol ethers are present in the compositions of the invention in an amount in the range of from about 0.5 to about 20% wt based on the total weight of the composition, and preferably from about 5 to about 10% wt.

Nonionic, anionic, cationic and amphoteric surfactants may be used in the compositions of the present invention. Nonionic surfactants are preferred. Such surfactants are generally commercially available. Useful nonionic surfactants include, but are not limited to, ethoxylated alkylphenols, fatty acid ethoxylates, fatty alcohol ethoxylates, ethylene oxide/propylene oxide ("EO/PO") condensates, and the like. Suitable ethoxylated alkylphenols include ethoxylation products of $(C_6-C_{14})$alkylphenols, that is alkylphenols having 6 to 14 carbon atoms in the alkyl chain, and a degree of ethoxylation of 2 to 20. Fatty acids or fatty alcohol ethoxylates with saturated or unsaturated hydrocarbon chains having 8 to 24 carbon atoms and a degree of ethoxylation of 2 to 20 are also suitable. Particularly suitable EO/PO condensates are those having about 10 to about 20 EO or PO units.

The surfactants are typically present in an amount of from about 0.1 to about 10% wt, preferably from about 0.5 to about 2% wt, and more preferably from about 1 to about 1.5% wt, based on the total weight of the composition.

Typically, deionized water is used in the present invention. Water is present in an amount sufficient to make up 100% wt, based on the total weight of the composition. Typically, the amount of water is from about 50 to about 98.9% wt based on the total weight of the composition, and preferably from about 75 to about 95% wt.

The pretreatment compositions of the present invention may optionally include one or more additives. Suitable additives include, but are not limited to, corrosion inhibitors, wetting agents, co-solvents, chelating agents and the like.

Any corrosion inhibitor which reduces the corrosion of metal film layers is suitable for use in the present invention. Suitable corrosion inhibitors include, but are not limited to, catechol; $(C_1-C_6)$alkylcatechol such as methylcatechol, ethylcatechol and tert-butylcatechol; benzotriazole; hydroxyanisole; $(C_1-C_{10})$alkylbenzotriazoles; $(C_1-C_{10})$ hydroxyalkylbenzotriazoles; 2-mercaptobenimidazole; gallic acid; gallic acid esters such as methyl gallate and propyl gallate; and the like. It is preferred that the corrosion inhibitor is catechol, $(C_1-C_6)$alkylcatechol, benzotriazole or $(C_1-C_{10})$alkylbenzotriazoles, 2-mercaptobenimidazole, and more preferably benzotriazole and tert-butylcatechol. Such corrosion inhibitors are generally commercially available from a variety of sources, such as Aldrich (Milwaukee, Wis.) and may be used without further purification.

When such corrosion inhibitors are used in the compositions of the present invention, they are typically present in an amount in the range of from about 0.01 to about 10% wt, based on the total weight of the composition. It is preferred that the amount of corrosion inhibitor is from about 0.2 to about 5% wt, more preferably about 0.5 to about 3% wt, and most preferably from about 1.5 to about 2.5% wt. It is preferred that a corrosion inhibitor is used.

Suitable cosolvents useful in the compositions are any which are water miscible and do not destabilize the present compositions. Such suitable cosolvents include, but are not limited to, polar aprotic solvents such as dimethyl sulfoxide, tetramethylene sulfone (or sulfolane), and dimethyl sufur dioxide; aminoalcohols such as aminoethylaminoethanol; $N-(C_1-C_{10})$alkylpyrrolidones such as N-methylpyrrolidone ("NMP"), N-ethylpyrrolidone, N-hydroxyethylpyrrolidone and N-cyclohexylpyrrolidone; amides such as dimethylacetamide ("DMAC") and the like. It is preferred that the cosolvent is selected from $N-(C_1-C_{10})$alkylpyrrolidones and amides, more preferably N-methylpyrrolidone, N-ethylpyrrolidone, N-hydroxyethylpyrrolidone, N-cyclohexylpyrrolidone and dimethylacetamide. It is further preferred that the compositions of the present invention are free of amine cosolvent, such as aminoalcohols. When such cosolvents are used they are typically present in an amount in the range of about 0.1 to about 20% wt, based on the total weight of the composition, preferably about 1 to about 10% wt, and more preferably from about 1 to about 5% wt.

The compositions of the present invention may be prepared by combining the one or more polyol compounds, one or more glycol ethers, water, one or more surfactants and optionally one or more additives in any order.

The compositions of the present invention are suitable for pretreating polymeric material to be removed from a substrate. The removal of any polymeric material, such as, but not limited to, photoresists, soldermasks, antireflective coatings, and the like, including such polymeric material that has been subjected to harsh process conditions such as plasma etching, auto-plasma ashing, ion implantation or ion milling processes, can be effectively enhanced by first contacting it with the pretreatment compositions of the present invention and then contacting it with known polymer stripping compositions. Any polymeric material subjected to the harsh treatment processes described above is referred to as "post-plasma etch polymeric residue" throughout this specification. The compositions and methods of the present invention are particularly useful in aiding removal of the organometallic polymeric residue present after a dry plasma etching, reactive ion etching and ion milling of materials, such as photoresists, conducting metal layers and insulating dielectric layers.

Polymeric residue on a substrate may be removed by first contacting the substrate with a composition of the present invention for a period of time sufficient to pretreat the polymeric material. The substrate may be contacted with the compositions of the present invention by any known means, such as immersion of the substrate in a bath, such as a wet chemical bench, containing a composition of the present invention such bath being at room temperature or heated, or by spraying a composition of the present invention at a desired temperature on the surface of the substrate. Typically, the polymeric material is contacted with the pretreatment compositions of the present invention for up to 30 minutes, preferably up to 20 minutes, and more preferably up to 15 minutes. Typically, polymeric material is pretreated with the compositions of the present invention from about 5 to about 15 minutes.

The pretreatment compositions of the present invention may be effectively used at a wide range of temperatures, such as but not limited to, up to about 60° C., preferably from about 20° C. to about 50° C., more preferably from about 23° C. to about 45° C., and most preferably from about 25° C. to about 35° C. An advantage of the pretreatment compositions is that they may be effectively used at ambient temperature.

Following contact with the compositions of the present invention, the substrate is then contacted with known polymer stripping compositions. The substrate may be contacted with the polymer stripping compositions by any known manner, such as immersion of the substrate in a bath, such as a wet chemical bench, containing the polymer stripping composition or by spraying a polymer stripping composition on the surface of the substrate. Any polymer stripping compositions may be advantageously used with the pretreatment compositions of the present invention. It is preferred that the polymer stripping compositions include one or more of one or more polyol compounds, one or more glycol ethers and water. The polymer stripping compositions typically contain one or more polymer removing components, such as but not limited to amines, alkanolamines, hydroxylamines, tetraalkylammonium hydroxides, ammonium bifluoride, ammonium-tetramethylammonium bifluoride, and the like. It is further preferred that the polymer removing agent is one or more of hydroxylamines, tetraalkylammonium hydroxides, ammonium bifluoride, and ammonium-tetramethylammonium bifluoride. Such polymer stripping compositions are generally well known and commercially available. Suitable polymer stripping compositions include those sold under the tradenames ACT-935 (available from Ashland), EKC-265 (available from EKC Technology, Hayward, Calif.), PRX-407 and PRX-120 (both available from Shipley Company\Silicon Valley Chemlabs, Sunnyvale, Calif.).

No special procedures are necessary for using the polymer stripping compositions following pretreatment of polymeric material with the compositions of the present invention. The polymer stripping compositions are typically used in the manner recommended by the manufacturer. Such polymer stripping compositions may be used at ambient temperature or may be heated.

It is preferred that the substrate is not rinsed until after the polymeric material has been subjected to the polymer stripping compositions. Following contact with the polymer stripping compositions, the substrate is typically rinsed such as with deionized water, and then dried such as by spin drying.

An advantage of the pretreatment of the present invention is that polymeric material may be effectively removed in less time as compared to the time required to remove such polymeric material without pretreatment. Thus, the time required for contact with polymer stripping compositions is reduced. By reducing the time a substrate is in contact with the harsh components of a polymer stripping composition, adverse effects on the substrate, such as corrosion and lifting of layers, are also reduced.

A further advantage of the compositions of the present invention is that they may be effectively used to pretreat polymeric material on substrates including one or more dielectric layers. Such pretreatment allows faster removal of the polymeric material when contacted with a polymer stripping composition. By increasing the rate of polymer removal, the substrate is exposed to the stripping composition for a shorter period of time and thus etching of the dielectric material is substantially reduced.

A still further advantage of the compositions of the present invention is that post-plasma etch polymeric material may be removed from a substrate such that etching of thermal oxide layers underneath metal lines is greatly reduced or eliminated.

The compositions of the present invention are particularly useful in aiding removal of post plasma etch residues when conventional strippers are not capable of removing such residues. Furthermore the present pretreatment compositions are substantially non-corrosive to substrates containing metals, particularly copper and aluminum. It is preferred that the compositions of the present invention are non-corrosive to metals, particularly copper and aluminum.

Thus, the compositions of the present invention are usefull in pretreating any polymeric material that needs to be removed during the manufacture of electronic devices, such as, but not limited to, flat panel display TFT/LCD manufacture, magneto-resistive and giant magneto-resistive thin film head manufacture, or read-write device manufacture. The compositions of the present invention are substantially inert, and preferably completely inert, to the metal films used in magneto-resistive and giant magneto-resistive thin film head manufacture such as, but not limited to, aluminum oxide ("$Al_2O_3$"), gold ("Au"), cobalt ("Co"), copper ("Cu"), iron ("Fe"), iridium ("Ir"), manganese ("Mn"), molybdenum ("Mo"), nickel ("Ni"), platinum ("Pt"), ruthenium ("Ru"), and zirconium ("Zr"), as well as other metals used in the manufacture of semiconductors and electronic materials, such as, but not limited to, copper, aluminum, nickel-iron, tungsten, titanium, titanium-nitride, tantalum, tantalum nitride.

The following examples are intended to illustrate further various aspects of the present invention, but are not intended to limit the scope of the invention in any aspect.

EXAMPLE 1

A pre-treatment solution was prepared by combining 5% MP-diol, 1% Japanese soap (a nonionic surfactant), 5% DPM with the balance being de-ionized ("DI") water.

EXAMPLE 2

A wafer containing sub-micron dual damascene vias to a copper metal layer and post plasma etched polymeric residue was examined by SEM which showed heavy polymer on the via bottoms as well as some sidewall polymer. The wafer was contacted with the solution of Example 1 (pretreated) for 1 minute at 23° C., removed from contact with the solution and placed in a polymer stripper (remover) bath containing 13% dimethylacetamide, 27% DPM, 28% DI water, and 28% MP-diol as active ingredients at 23° C. for 10 minutes. The wafer was then removed from the stripping bath, rinsed for 5 minutes with the solution from Example 1 for 5 minutes, rinsed with DI water for 2 minutes and then dried. SEM analysis showed the wafer to be clean with no polymer in the bottom of the vias and no sidewall polymer remaining.

EXAMPLE 3 (Comparative)

The procedure of Example 2 was repeated except that the wafer was first contacted with the polymer remover bath for 30 minutes at 23° C. The wafer was removed from the bath and placed in a bath containing the solution from Example 1 for 15 minutes. After removal from the bath, the wafer was then rinsed with DI water for 5 minutes and dried. SEM analysis showed the wafer to be mostly clean with polymer still remaining in the bottoms of the vias.

EXAMPLE 4

A wafer containing sub-micron vias to an aluminum metal layer and post plasma etched polymeric residue was examined by SEM which showed heavy polymer on the via sidewalls. The wafer was contacted with the solution of Example 1 (pretreated) for 1 minute at 23° C., removed from contact with the solution and placed in the polymer stripper (remover) bath of Example 2 at 23° C. for 10 minutes. The wafer was then removed from the stripping bath, rinsed for 5 minutes with the solution from Example 1 for 5 minutes, rinsed with DI water for 5 minutes and then dried. SEM analysis showed the wafer to be clean with no sidewall polymer remaining.

EXAMPLE 5

The procedure of Example 4 was repeated except that the wafer was not subjected to a pretreatment step. After contact with the polymer stripping bath, the wafer was then rinsed with DI water for 5 minutes and dried. SEM analysis showed some sidewall polymer remaining.

EXAMPLE 6

A wafer containing post plasma etch sidewall polymer residue was contacted with the solution of Example 1 for 30 minutes at 23° C. After removing the wafer from contact with the solution, the wafer was rinsed with DI water for 5 minutes and dried. SEM analysis of the wafer showed that the solution of Example 1 by itself was ineffective in removing post plasma etch sidewall polymer.

The above examples clearly show that the solutions of the present invention are effective in pretreating substrates containing polymeric residue to be removed. Such pretreatment results in shorter contact times of the substrates with the polymer stripping baths as well as more complete removal of polymeric material, particularly post plasma etch polymeric material.

What is claimed is:

1. A method for preparing integrated circuits comprising one or more polymeric materials to be removed comprising the steps of;
    a) contacting the polymeric material with a pretreatment composition comprising one or more one or more polyol compounds, one or more glycol ethers, water and one or more surfactants for a period of time sufficient to pretreat the polymeric material;
    b) removing the polymeric material from contact with the pretreatment composition; and
    c) then contacting the polymeric material with a polymer stripping composition;
    wherein the pretreatment composition is substantially free of amines, alkanolamines, hydroxylamines, tetraalkylammonium hydroxides, ammonium bifluoride, ammonium-tetramethylammonium bifluoride, and alkali metal hydroxides.

2. The method of claim 1 wherein wherein the polyol compound is selected from ($C_2$–$C_{20}$)alkanediols, substituted ($C_2$–$C_{20}$)alkanediols, ($C_2$–$C_{20}$)alkanetriols or substituted ($C_2$–$C_{20}$)alkanetriols.

3. The method of claim 1 wherein the polyol is selected from ethylene glycol, propylene glycol, diethylene glycol, dipropylene glycol, triethylene glycol, tripropylene glycol, 2-methyl-1,3-propanediol, butanediol, pentanediol, hexanediol, or glycerol.

4. The method of claim 1 wherein the glycol ether is selected from ($C_1$–$C_{20}$)alkanediol ($C_1$–$C_6$)alkyl ethers or ($C_1$–$C_{20}$)alkanediol di($C_1$–$C_6$)alkyl ethers.

5. The method of claim 1 wherein the glycol ether is selected from ethylene glycol monomethyl ether, diethylene glycol monomethyl ether, propylene glycol monomethyl ether, propylene glycol dimethyl ether, propylene glycol mono-n-butyl ether, dipropylene glycol monomethyl ether, dipropylene glycol dimethyl ether, dipropylene glycol mono-n-butyl ether or tripropylene glycol monomethyl ether.

6. The method of claim 1 wherein at least one surfactant is a nonionic surfactant.

7. The method of claim 6 wherein the nonionic surfactant is selected from ethoxylated alkylphenols, fatty acid ethoxylates, fatty alcohol ethoxylates, or ethylene oxide/propylene oxide ("EO/PO") condensates.

8. A method for preparing magnetic thin film heads comprising the steps of:
    a) contacting a magnetic thin film head precursor containing a polymeric material to be removed with a pretreatment composition comprising one or more polyol compounds, one or more glycol ethers, water and one or more surfactants for a period of time sufficient to pretreat the polymeric material;
    b) removing the polymeric material from contact with the pretreatment composition; and
    c) then contacting the polymeric material with a polymer stripping composition;
    wherein the pretreatment composition is substantially free of amines, alkanolamines, hydroxylamines, tetraalkylammonium hydroxides, ammonium bifluoride, ammonium-tetramethylammonium bifluoride, and alkali metal hydroxides.

* * * * *